(12) United States Patent
Tuominen et al.

(10) Patent No.: US 10,770,444 B2
(45) Date of Patent: *Sep. 8, 2020

(54) ELECTRONICS PACKAGE HAVING A MULTI-THICKNESS CONDUCTOR LAYER AND METHOD OF MANUFACTURING THEREOF

(71) Applicant: General Electric Company, Schenectady, NY (US)

(72) Inventors: Risto Ilkka Tuominen, Tokyo (JP); Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/963,559

(22) Filed: Apr. 26, 2018

(65) Prior Publication Data

US 2018/0247924 A1 Aug. 30, 2018

Related U.S. Application Data

(63) Continuation of application No. 15/343,252, filed on Nov. 4, 2016, now Pat. No. 9,966,371.

(51) Int. Cl.
*H01L 25/00* (2006.01)
*H01L 23/498* (2006.01)
(Continued)

(52) U.S. Cl.
CPC .......... *H01L 25/50* (2013.01); *H01L 21/4853* (2013.01); *H01L 21/4857* (2013.01);
(Continued)

(58) Field of Classification Search
CPC ..... H01L 25/50; H01L 25/0657; H01L 25/16; H01L 25/18; H01L 21/4853;
(Continued)

(56) References Cited

U.S. PATENT DOCUMENTS

| 5,874,770 A | 2/1999 | Saia et al. |
| 7,791,897 B2 | 9/2010 | Das et al. |
| (Continued) | | |

FOREIGN PATENT DOCUMENTS

| JP | 2015177163 A | 10/2015 |
| WO | 0067538 A1 | 11/2000 |

OTHER PUBLICATIONS

Park et al., "Dielectric Composite Material with Good Performance and Process Ability for Embedding of Active and Passive Components into PCBs," Electronic Components and Technology Conference (ECTC), 2013 IEEE 63rd, pp. 1325-1331, Las Vegas, NV.

(Continued)

*Primary Examiner* — Tong-Ho Kim
(74) *Attorney, Agent, or Firm* — Ziolkowski Patent Solutions Group, SC

(57) ABSTRACT

An electronics package includes an insulating substrate, a first electrical component coupled to a first surface of the insulating substrate, and a first conductor layer formed on the first surface of the insulating substrate. A second conductor layer is formed on a second surface of the insulating substrate, opposite the first surface, the second conductor layer extending through vias in the insulating substrate to contact at least one contact pad of the first electrical component and couple with the first conductor layer. The electronics package also includes a second electrical component having at least one contact pad coupled to the first conductor layer. The first conductor layer has a thickness greater than a thickness of the second conductor layer.

28 Claims, 7 Drawing Sheets

(51) Int. Cl.

| | | |
|---|---|---|
| *H01L 25/065* | (2006.01) | |
| *H01L 21/48* | (2006.01) | |
| *H01L 25/18* | (2006.01) | |
| *H01L 23/00* | (2006.01) | |
| *H01L 25/16* | (2006.01) | |
| *H01L 23/538* | (2006.01) | |
| *H01L 23/31* | (2006.01) | |

(52) U.S. Cl.
CPC .. *H01L 23/49811* (2013.01); *H01L 23/49827* (2013.01); *H01L 23/49844* (2013.01); *H01L 23/5383* (2013.01); *H01L 24/19* (2013.01); *H01L 24/24* (2013.01); *H01L 24/82* (2013.01); *H01L 24/97* (2013.01); *H01L 25/0657* (2013.01); *H01L 25/16* (2013.01); *H01L 25/18* (2013.01); *H01L 21/486* (2013.01); *H01L 23/3121* (2013.01); *H01L 23/5384* (2013.01); *H01L 23/5387* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/0401* (2013.01); *H01L 2224/04105* (2013.01); *H01L 2224/06181* (2013.01); *H01L 2224/08235* (2013.01); *H01L 2224/12105* (2013.01); *H01L 2224/131* (2013.01); *H01L 2224/1329* (2013.01); *H01L 2224/13339* (2013.01); *H01L 2224/16235* (2013.01); *H01L 2224/16238* (2013.01); *H01L 2224/291* (2013.01); *H01L 2224/2919* (2013.01); *H01L 2224/29139* (2013.01); *H01L 2224/32225* (2013.01); *H01L 2224/32245* (2013.01); *H01L 2224/73253* (2013.01); *H01L 2224/73267* (2013.01); *H01L 2224/8184* (2013.01); *H01L 2224/81801* (2013.01); *H01L 2224/82031* (2013.01); *H01L 2224/82039* (2013.01); *H01L 2224/82047* (2013.01); *H01L 2224/8309* (2013.01); *H01L 2224/83091* (2013.01); *H01L 2224/83191* (2013.01); *H01L 2224/83192* (2013.01); *H01L 2224/83851* (2013.01); *H01L 2224/83862* (2013.01); *H01L 2224/83865* (2013.01); *H01L 2224/83874* (2013.01); *H01L 2224/9222* (2013.01); *H01L 2224/92144* (2013.01); *H01L 2224/92225* (2013.01); *H01L 2224/97* (2013.01); *H01L 2225/06517* (2013.01); *H01L 2225/06541* (2013.01); *H01L 2225/06555* (2013.01); *H01L 2924/1033* (2013.01); *H01L 2924/10253* (2013.01); *H01L 2924/10272* (2013.01); *H01L 2924/10329* (2013.01); *H01L 2924/1302* (2013.01); *H01L 2924/1305* (2013.01); *H01L 2924/13023* (2013.01); *H01L 2924/13034* (2013.01); *H01L 2924/13055* (2013.01); *H01L 2924/13091* (2013.01); *H01L 2924/143* (2013.01); *H01L 2924/1431* (2013.01); *H01L 2924/1433* (2013.01); *H01L 2924/1434* (2013.01); *H01L 2924/15311* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC .............. H01L 21/4857; H01L 21/486; H01L 23/49811; H01L 23/49827; H01L 23/49844; H01L 23/5383; H01L 23/3121; H01L 23/5384; H01L 23/5387; H01L 24/19; H01L 24/24; H01L 24/82; H01L 24/97; H01L 24/13; H01L 24/16; H01L 24/32; H01L 24/73; H01L 24/81; H01L 24/83; H01L 24/92; H01L 2224/0401; H01L 2224/04105; H01L 2224/06181; H01L 2224/08235; H01L 2224/12105; H01L 2224/131; H01L 2224/1329; H01L 2224/13339; H01L 2224/16235; H01L 2224/16238; H01L 2224/291; H01L 2224/29139; H01L 2224/2919; H01L 2224/32225; H01L 2224/32245; H01L 2224/73253; H01L 2224/73267; H01L 2224/81801; H01L 2224/8184; H01L 2224/82031; H01L 2224/82039; H01L 2224/82047; H01L 2224/8309; H01L 2224/83091; H01L 2224/83191; H01L 2224/83192; H01L 2224/83851; H01L 2224/83862; H01L 2224/83865; H01L 2224/83874; H01L 2224/92144; H01L 2224/9222; H01L 2224/92225; H01L 2224/97; H01L 2225/06517; H01L 2225/06541; H01L 2225/06555; H01L 2924/10253; H01L 2924/10272; H01L 2924/10329; H01L 2924/1033; H01L 2924/1302; H01L 2924/13023; H01L 2924/13034; H01L 2924/13055; H01L 2924/13091; H01L 2924/1305; H01L 2924/143; H01L 2924/1431; H01L 2924/1433; H01L 2924/1434; H01L 2924/15311; H01L 2924/15313; H01L 2924/19041; H01L 2924/19042; H01L 2924/19043; H01L 2924/19105
USPC ........................................................ 257/774
See application file for complete search history.

(56) References Cited

U.S. PATENT DOCUMENTS

| | | | |
|---|---|---|---|
| 8,049,338 | B2 | 11/2011 | Delgado et al. |
| 8,114,712 | B1 | 2/2012 | McConnelee et al. |
| 8,368,201 | B2 | 2/2013 | Tuominen |
| 8,466,007 | B2 | 6/2013 | Delgado et al. |
| 8,716,870 | B2 | 5/2014 | Gowda |
| 8,778,738 | B1 | 7/2014 | Lin et al. |
| 8,987,876 | B2 | 3/2015 | Gowda et al. |
| 9,177,957 | B1 | 11/2015 | Lee et al. |
| 9,209,151 | B2 | 12/2015 | Chauhan et al. |
| 9,966,361 | B1 | 5/2018 | Tuominen et al. |
| 2002/0173134 | A1 | 11/2002 | Viswanadam et al. |
| 2007/0155057 | A1 | 7/2007 | Wang |
| 2007/0235810 | A1 | 10/2007 | Delgado et al. |
| 2008/0136002 | A1 | 6/2008 | Yang |
| 2008/0296056 | A1 | 12/2008 | Kinoshita et al. |
| 2008/0318027 | A1 | 12/2008 | Woychik et al. |
| 2009/0039510 | A1 | 2/2009 | Jobetto |
| 2009/0072379 | A1 | 3/2009 | Ewe et al. |
| 2010/0052129 | A1 | 3/2010 | Lihola et al. |
| 2010/0059854 | A1 | 3/2010 | Lin et al. |
| 2011/0068461 | A1 | 3/2011 | England |
| 2012/0018876 | A1 | 1/2012 | Wu et al. |
| 2012/0112345 | A1 | 5/2012 | Blackwell et al. |
| 2013/0075924 | A1 | 3/2013 | Lin et al. |
| 2013/0093097 | A1 | 4/2013 | Yu et al. |
| 2014/0264799 | A1* | 9/2014 | Gowda ............... H01L 23/3677 257/675 |
| 2015/0083469 | A1 | 3/2015 | Sunohara et al. |
| 2015/0084207 | A1* | 3/2015 | Chauhan ................ H01L 24/26 257/774 |
| 2015/0115458 | A1 | 4/2015 | Palm |
| 2015/0179616 | A1 | 6/2015 | Lin et al. |

(56) References Cited

U.S. PATENT DOCUMENTS

| | | |
|---|---|---|
| 2015/0244313 A1 | 8/2015 | McNamara et al. |
| 2015/0255420 A1 | 9/2015 | Saito |
| 2015/0380356 A1 | 12/2015 | Chauhan et al. |
| 2016/0056136 A1 | 2/2016 | McConnelee et al. |
| 2016/0148887 A1 | 5/2016 | Yu et al. |
| 2016/0172344 A1 | 6/2016 | We et al. |
| 2017/0033090 A1 | 2/2017 | Hsieh et al. |
| 2017/0053896 A1 | 2/2017 | Yu et al. |
| 2017/0207160 A1* | 7/2017 | Gowda ............ H01L 23/49838 |
| 2018/0130747 A1 | 5/2018 | Tuominen et al. |
| 2018/0130762 A1 | 5/2018 | Tuominen et al. |

OTHER PUBLICATIONS

Braun et al., "Through Mold Vias for Stacking of Mold Embedded Packages," Electronic Components and Technology Conference (ECTC), 2011 IEEE 61st, pp. 48-54, May 31, 2011-Jun. 3, 2011, Lake Buena Vista, FL.

\* cited by examiner

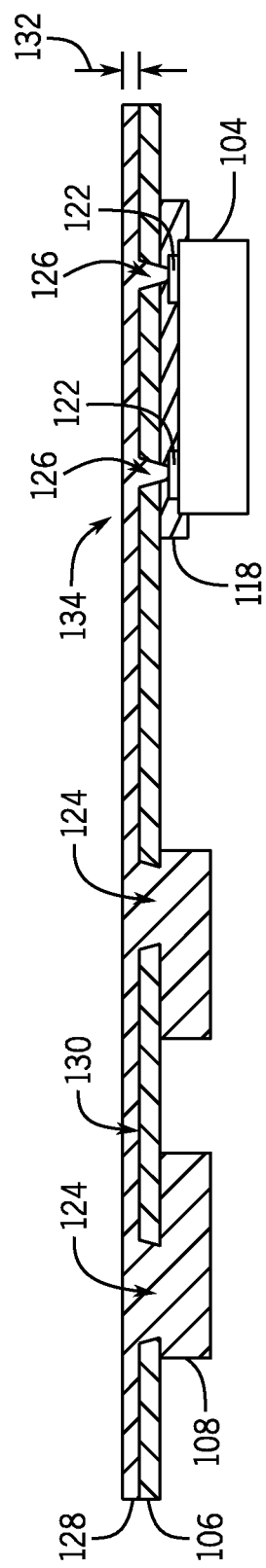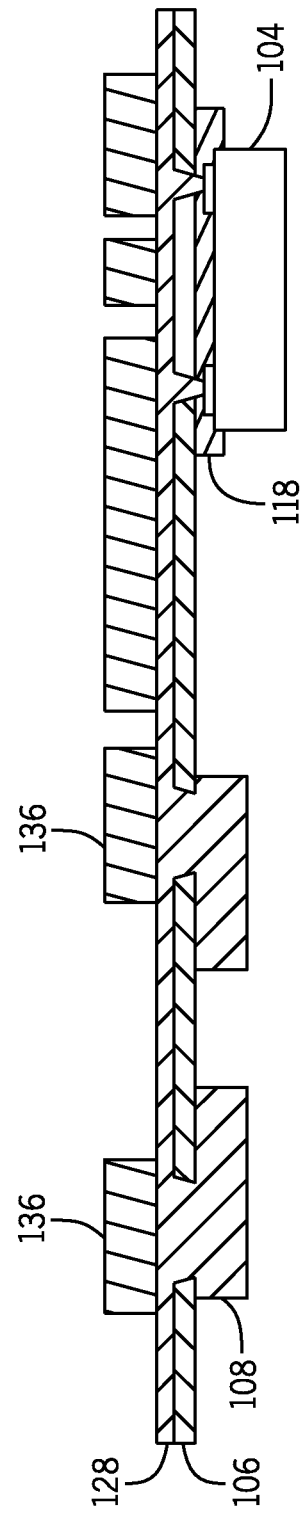
FIG. 5
FIG. 6

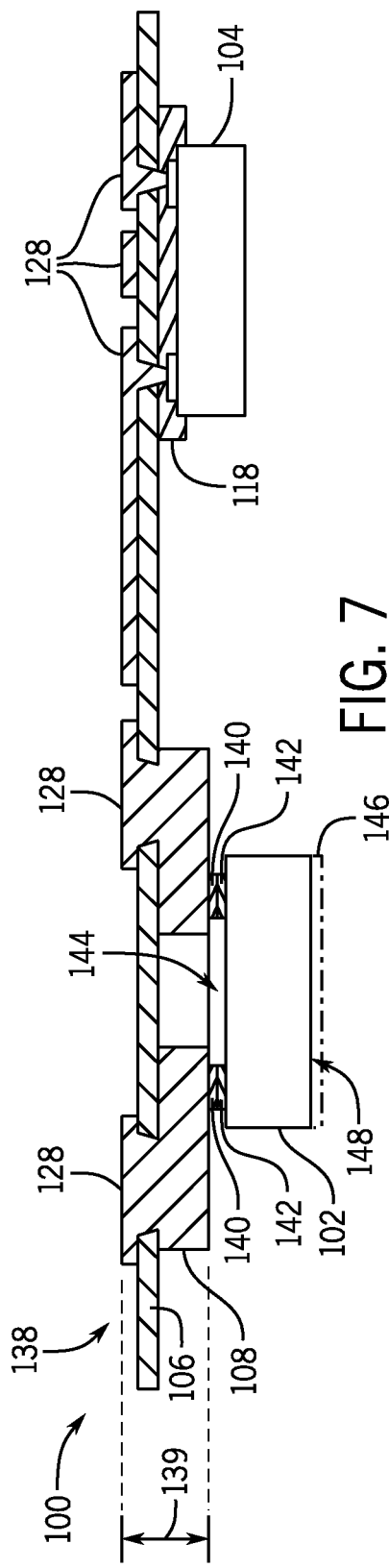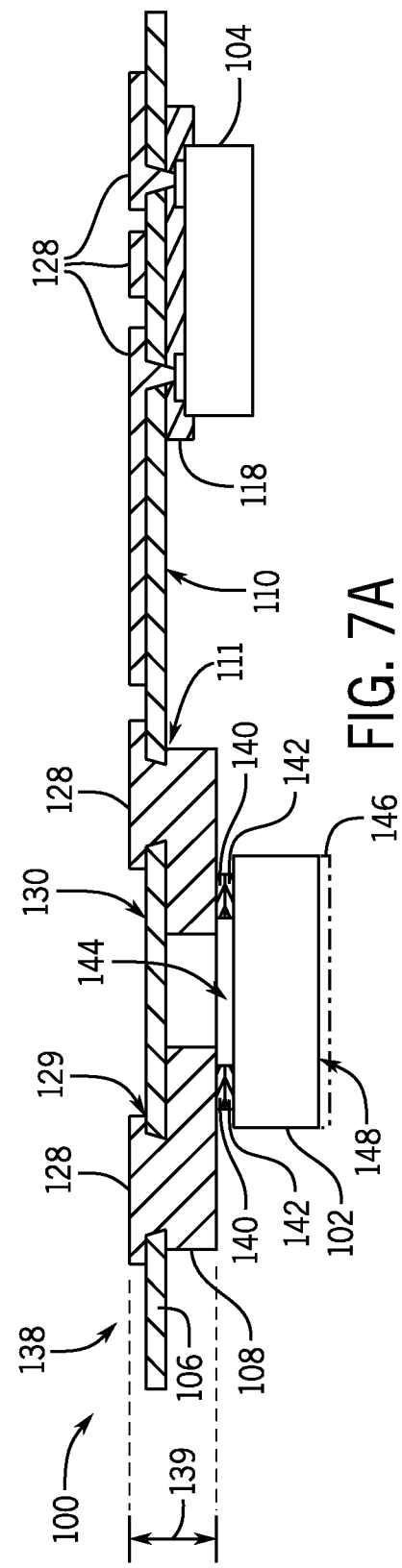

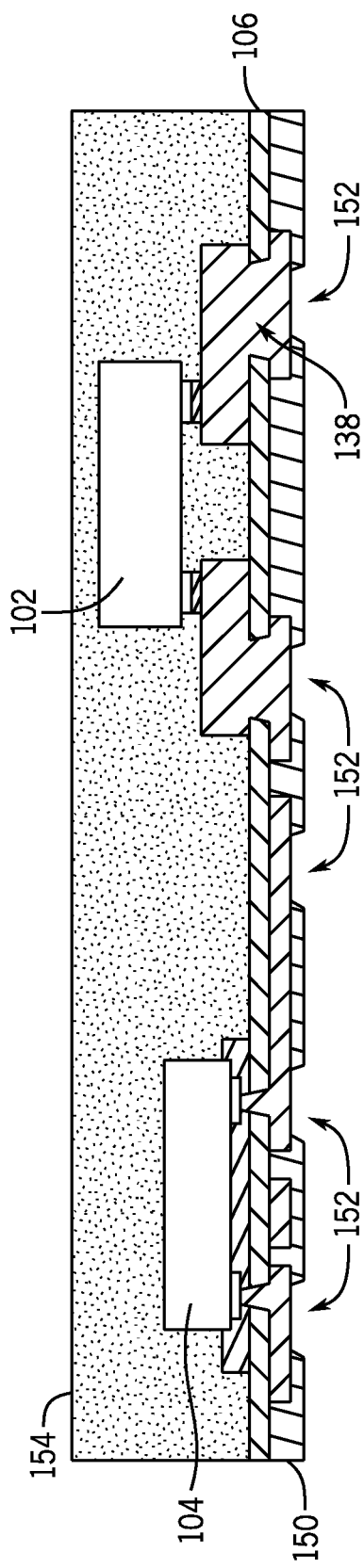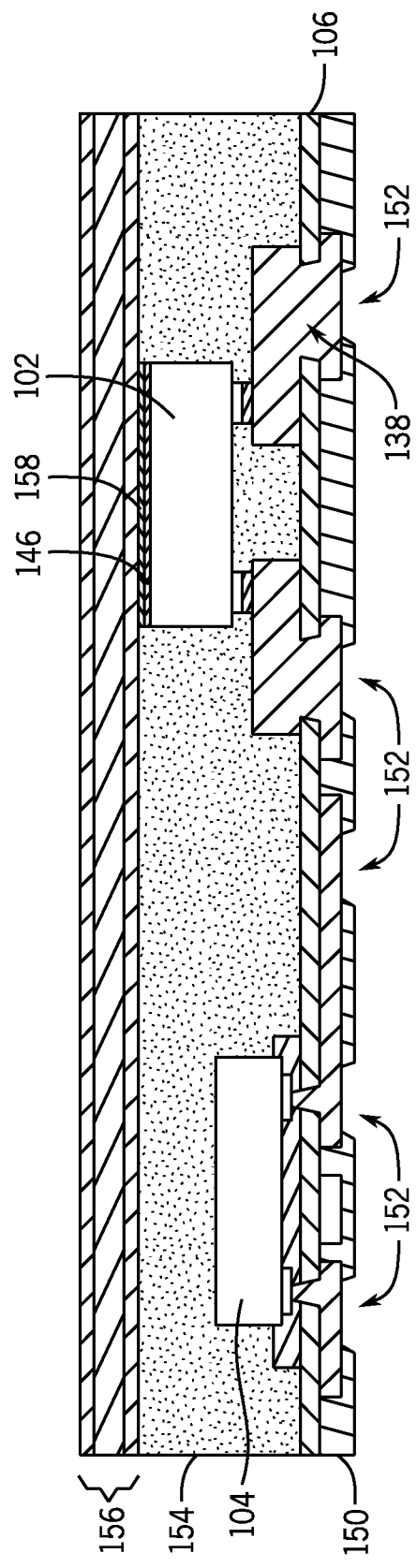

ELECTRONICS PACKAGE HAVING A MULTI-THICKNESS CONDUCTOR LAYER AND METHOD OF MANUFACTURING THEREOF

CROSS-REFERENCE TO RELATED APPLICATION

The present application is a continuation of, and claims priority to, U.S. patent application Ser. No. 15/343,252, filed Nov. 4, 2016, the disclosure of which is incorporated herein by reference in its entirety.

BACKGROUND OF THE INVENTION

Embodiments of the invention relate generally to semiconductor device packages or electronics packages and, more particularly, to an electronics package that includes a conductor with locally varied thicknesses. This multi-thickness conductor includes a combination of regions having high current carrying capabilities and high density routing capabilities and facilitates the integration of different types of electronics devices in a miniaturized package topology.

As semiconductor device packages have become increasingly smaller and yield better operating performance, packaging technology has correspondingly evolved from leaded packaging, to laminated-based ball grid array (BGA) packaging, to chip scale packaging (CSP), then flipchip packages, and now buried die/embedded chip build-up packaging. Advancements in semiconductor chip packaging technology are driven by ever-increasing needs for achieving better performance, greater miniaturization, and higher reliability.

A challenge to existing manufacturing techniques is the miniaturization of electronics packages that incorporate different types of individually packaged semiconductor dies that have different current carrying and routing density requirements, such as a mixture digital semiconductor devices and power semiconductor devices. The general structure of a prior art electronics package 10 incorporating a number of individually packaged components 12, 14, 16, 18 is shown in FIG. 1. The individually packaged components 12, 14, 16, 18 are mounted on a multi-layer printed circuit board (PCB) 20 that has a thickness 22 of approximately 31 to 93 mils. The individually packaged components 12, 14, 16, 18 may be power semiconductor packages, packaged controllers, or other discrete electrical components such as inductors or passive components that are coupled to electrical contacts 24 of PCB 20 using metalized connections 26 such as, for example, solder balls in the form of a ball grid array (BGA).

In the illustrated example, individually packaged devices 14, 16 each include a respective semiconductor device or die 28, 30 having contact pads 32 formed on an active surface thereof. Die 28, 30 are provided on a mounting platform 34, 36 and encased within an insulating material 38, 40. Wirebonds 42, 44 form direct metal connections between active surfaces of respective die 28, 30 and a metalized input/output (I/O) provided on or coupled to the lower surface of die 28, 30. In the case of discrete component 14, wirebonds 42 form an electrical connection between contact pads 32 of die 28 to I/O pads 46 provided on a bottom surface of discrete component 14. Wirebond 42 electrically couples contact pads 32 to I/O leads 48. Where die 30 is a diode, for example, wirebond 42 may connect to the anode on a first surface of the die 30 and a second surface of the die 30 may be soldered to the leadframe. I/O pads 46 and I/O leads 48 are coupled to electrical contacts 24 of PCB 20 by way of metalized connections 26. The overall thickness 50 of such prior art IC packages may be in the range of 500 µm-2000 µm or larger.

Alternatively, electrical connections between components may be realized using a combination of thick and thin conductor layers that are electrically connected to the appropriate semiconductor dies or power devices using through hole or via technology. However, inclusion of multiple routing layers adds considerable thickness to the overall electronics package, a factor that in combination with the complex conductor structure, limits product level miniaturization, design flexibility, and cost efficiency. Additionally, both of the aforementioned techniques include multiple routing layers, which results in a long and complex conductor structure between electrical components and weakens the electrical performance of the overall package, which is increasingly unfavorable in high performance packaging (e.g., high frequency, RF, intelligent power, and other advanced electronics packaging).

Accordingly, it would be desirable to provide a new electronics packaging technology that permits electrical components of different types to be integrated into a highly miniaturized electronics package with locally enhanced electrical and thermal conductivity for certain electronics components and increased routing density in regions proximate other electronics components. It would further be desirable for such a packaging technology to permit a shorter conductor length between electrical components and improve signal fidelity.

BRIEF DESCRIPTION OF THE INVENTION

In accordance with one aspect of the invention, an electronics package includes an insulating substrate, a first electrical component coupled to a first surface of the insulating substrate, and a first conductor layer formed on the first surface of the insulating substrate. A second conductor layer is formed on a second surface of the insulating substrate, opposite the first surface, the second conductor layer extending through vias in the insulating substrate to contact at least one contact pad of the first electrical component and couple with the first conductor layer. The electronics package also includes a second electrical component having at least one contact pad coupled to the first conductor layer. The first conductor layer has a thickness greater than a thickness of the second conductor layer.

In accordance with another aspect of the invention, a method of manufacturing an electronics package includes providing an insulating substrate, forming a first conductor layer on a first surface of the insulating substrate, and coupling a first electrical component to the first surface of the insulating substrate. The method also includes coupling a second electrical component to the first conductor layer and forming a second conductor layer on a second surface of the insulating substrate, opposite the first surface. The second conductor layer extends through vias formed in the insulating substrate to electrically couple with the first conductor layer and contact at least one contact pad on the first electrical component. The first conductor layer is formed having a thickness greater than a thickness of the second conductor layer.

In accordance with yet another aspect of the invention, an electronics package includes an insulating substrate having a top surface and a bottom surface and a multi-thickness conductor extending through vias in the insulating substrate. The multi-thickness conductor includes a first conductor layer formed on the bottom surface of the insulating substrate and a second conductor layer formed on the top surface of the insulating substrate and electrically coupled with the first patterned conductor layer through a portion of the vias, the second patterned conductor layer having a thickness less than a thickness of the first patterned conductor layer. A first electrical component is affixed to the bottom surface of the insulating substrate, the first electrical component having a plurality of contact pads electrically coupled to the second conductor layer through another portion of the vias. A second electrical component having at least one contact pad is coupled to the first conductor layer.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-7A are schematic cross-sectional side views of an electronics package during various stages of a manufacturing/build-up process according embodiments of the invention.

FIG. 8 is a schematic cross-sectional side view of the electronics package of FIG. 7 further including an insulating material surrounding the electrical components, according to another embodiment of the invention.

FIG. 9 is a schematic cross-sectional side view of the electronics package of FIG. 7 further including a direct bond copper (DBC) substrate, according to another embodiment of the invention.

DETAILED DESCRIPTION

Figure 1:
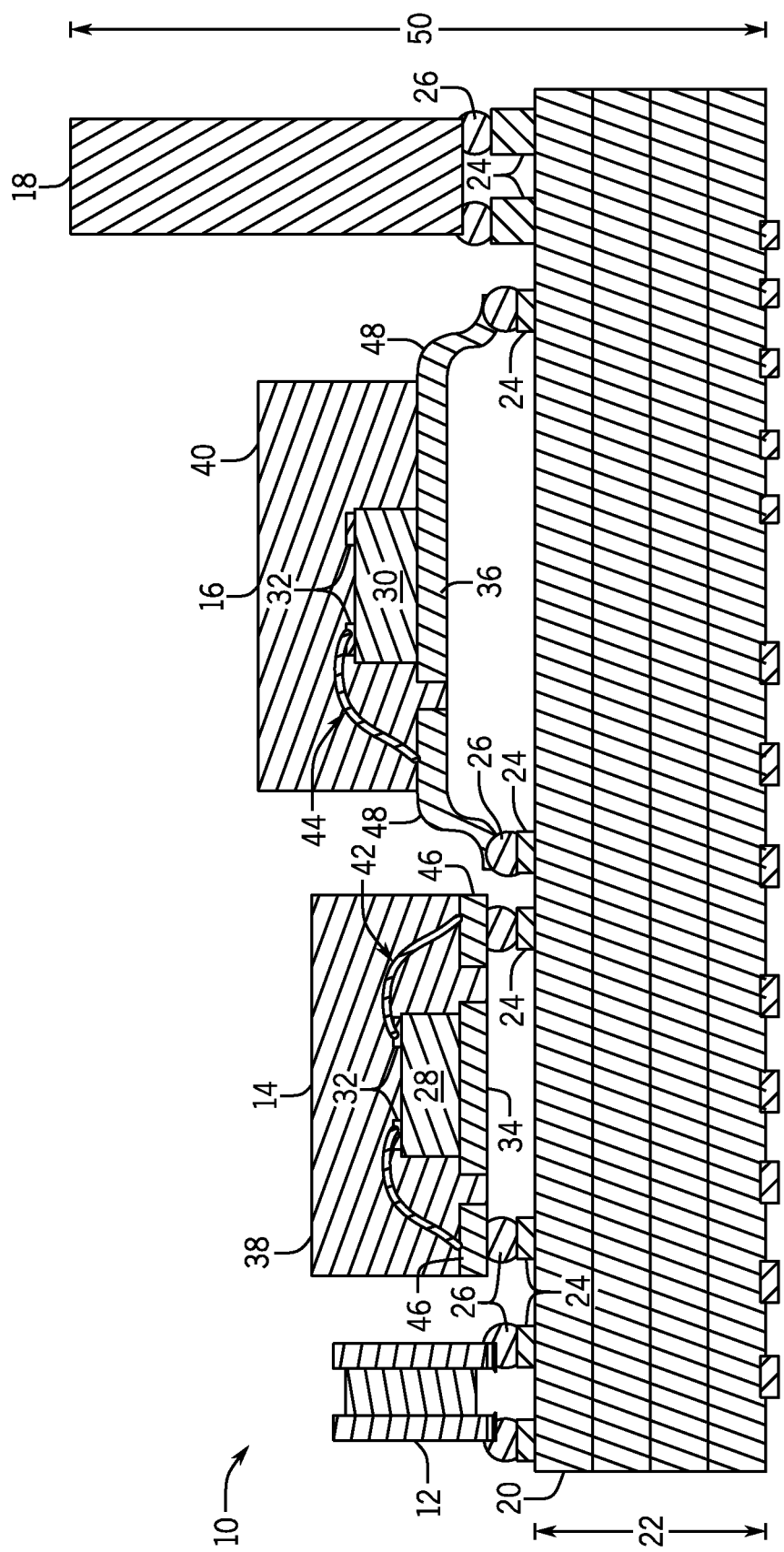
FIG. 1 is a schematic cross-sectional side view of a prior art electronics package incorporating a power die and a digital die.

Embodiments of the present invention provide for an electronics package that includes multiple semiconductor devices, dies, or chips coupled to a patterned conductor layer with locally varied thicknesses. This multi-thickness conductor layer is formed on opposing surfaces of an insulating substrate, extends through the insulating substrate, and includes regions having different routing density and current carrying capabilities. As described in more detail below, portions of the multi-thickness conductor layer include a low density routing pattern that provides the requisite current carrying capabilities for one type of electrical component, such as a power semiconductor die, while other, thinner portions of the conductor layer have a high density routing pattern that enables routing capability below 100/100 μm L/S for another type of electrical component, such as a digital semiconductor die.

As used herein, the phrase "power semiconductor device" refers to a semiconductor component, device, die or chip designed to carry a large amount of current and/or support a large voltage. Power semiconductor devices are typically used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). In use, power semiconductor devices are typically mounted to an external circuit by way of a packaging structure, with the packaging structure providing an electrical connection to the external circuit and also providing a way to remove the heat generated by the devices and protect the devices from the external environment. Typical power semiconductor devices include two (2) to four (4) input/output (I/O) interconnections to electrically connect both sides of a respective power semiconductor device to an external circuit.

As used herein, the phrase "digital semiconductor device" refers to a semiconductor component, device, die, or chip provided in the form of a digital logic device, such as a microprocessor, microcontroller, memory device, video processor, or an Application Specific Integrated Circuit (ASIC), as non limiting examples. As is understood in the art, digital semiconductor devices have reduced current carrying requirements and require increased routing density as compared to power semiconductor devices due to the differences in interconnection pitch and number of I/Os between the device types. A digital semiconductor device may include anywhere between ten and thousands of I/Os depending on the device configuration.

While the electrical components embedded in the electronics package are referenced below in the embodiments of FIGS. 2-15 specifically as one or more power semiconductor devices in combination with one or more digital semiconductor devices, it is understood that other combinations of differently configured electrical components could be substituted in the electronics package, and thus embodiments of the invention are not limited only to the embedding of power devices and digital devices in a common electronics package. That is, the technique of using locally varied planar conductor thicknesses may be extended to electronics packages with any combination of electrical components having differing current carrying capabilities and routing density structures. Thus, the electronics package embodiments described below should also be understood to encompass electronics packages including resistors, capacitors, inductors, filters, or other similar devices, provided either alone or in combination with one or more power or digital devices. Additionally, while the embodiments of FIGS. 2-15 are described as including one power device and one digital device, it is contemplated that the concepts described herein may be extended to electronics packages that include any combination of three or more electrical components.

Referring now to FIGS. 2-7, cross-sectional views showing the various build up steps of a technique for manufacturing an electronics package 100 are illustrated according to an embodiment of the invention. A cross-section of the build-up process for a singular electronics package 100 is shown in FIGS. 2-7 for ease of visualization of the build-up process. However, one skilled in the art will recognize that multiple electronics packages could be manufactured in a similar manner at the panel level and then singulated into individual electronics packages as desired. As described in detail below, electronics package 100 includes a combination of different semiconductor devices or die 102, 104. In the illustrated embodiment described herein, die 102 is a power semiconductor device and die 104 is a digital semiconductor device. However, electronics package 100 may include any combination of electrical components requiring different current carrying and routing density capabilities in alternative embodiments.

Figure 2:
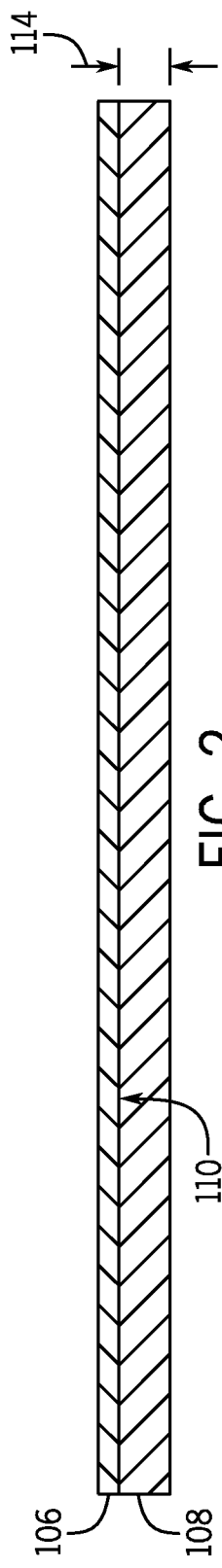

Referring first to FIG. 2, the manufacturing technique begins by plating an insulating substrate 106 with a first conductor layer 108. According to various embodiments, insulating substrate 106 may be provided in the form of an insulating film or dielectric substrate, such as for example a Kapton® laminate flex, although other suitable materials may also be employed, such as Ultem®, polytetrafluoroethylene (PTFE), or another polymer film, such as a liquid crystal polymer (LCP) or a polyimide substrate, as non-limiting examples. First conductor layer 108 is an electrically conductive metal such as, for example, copper. However, other electrically conducting materials or a combination of metal and a filling agent may be used in other embodiments. First conductor layer 108 may be applied directly to the bottom surface 110 of insulating substrate 106 using a sputtering and electroplating technique or other electroless method of metal deposition. Alternatively, a titanium adhesion layer and copper seed layer 111 (FIG. 7A) may first be applied to the bottom surface 110 of insulating substrate 106 using a sputtering process, followed by an electroplating process that increases a thickness 114 of the first conductor layer 108 to a desired level. In the embodiments described herein, thickness 114 may be in the range of 25 μm-250 μm. However, it is contemplated that first conductor layer 108 may be formed having a thickness outside this range of values in alternative embodiments. In yet another embodiment, the manufacturing technique may begin by providing a metal-clad insulating film.

Figure 3:
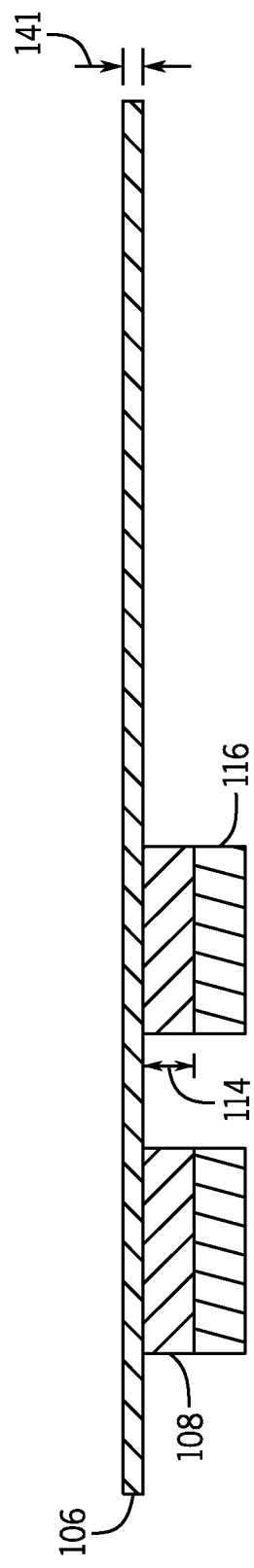

Next a first layer photoresist mask 116, shown in FIG. 3, is formed on first conductor layer 108 and is patterned with openings for a high current, I/O routing layer. With the first layer photoresist mask 116 in place, first conductor layer 108 is subsequently patterned using an etching process. After the first layer photoresist mask 116 is removed, one or multiple organic or inorganic coating layers (not shown), such as organic solderability preservative (OSP) or Ni/Au, may be applied to the surface of first conductor layer 108.

Figure 4:
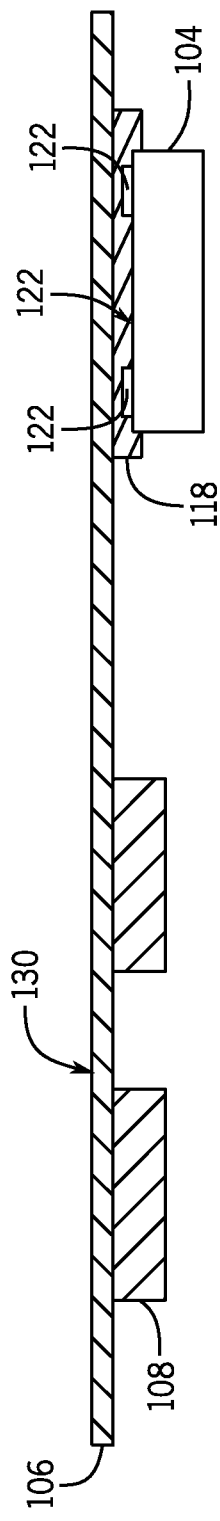

A layer of insulating material 118 is used to affix a digital semiconductor device 104 to insulating substrate 106, as shown in FIG. 4. As used herein the phrase "insulating material" refers to an electrically insulating material that adheres to surrounding components of the electronics package such as a polymeric material (e.g., epoxy, liquid crystal polymer, ceramic or metal filled polymers) or other organic material as non-limiting examples. In some embodiments, insulating material 118 may be provided in either an uncured or partial cured (i.e., B-stage) form. In the illustrated embodiment, insulating material 118 is limited to a select portion of bottom surface 110 of insulating substrate 106, however, insulating material 118 may be applied to coat the entirety of bottom surface 110 and all or portions of exposed surfaces of patterned first conductor layer 108 in alternative embodiments. Insulating material 118 may be applied using a coating technique such as spin coating or slot die coating, using a lamination or spray process, or may be applied by a programmable dispensing tool in the form of an inkjet printing-type device technique, as non-limiting examples. Alternatively, insulating material 118 may be applied to digital semiconductor device 104 prior to placement on insulating substrate 106. In alternative embodiments, digital semiconductor device 104 may be affixed to insulating substrate 106 by way of an adhesive property of the insulating substrate 106 itself.

Digital semiconductor device 104 is positioned into insulating material 118 using conventional pick and place equipment and methods. As shown, digital semiconductor device 104 is positioned with respect to insulating substrate 106 such that a top surface or active surface 120 comprising electrical contact pads 122 or connection pads is positioned into insulating material 118. Contact pads 122 provide conductive routes (I/O connections) to internal contacts within digital semiconductor device 104 and may have a composition that includes a variety of electrically conductive materials such as aluminum, copper, gold, silver, nickel, or combinations thereof as non-limiting examples. As understood in the art, the number of contact pads 122 on digital semiconductor device 104 is dependent upon the complexity and intended functionality of device 104. The pad pitch (i.e., the center-to-center distance between adjacent contact pads) is inversely proportional to the number of contact pads 122 provided on digital semiconductor device 104. While not shown in the illustrated embodiment, it is contemplated that other discrete or passive devices, such as, for example, a resistor, a capacitor, or an inductor, may be affixed to insulating substrate 106 by way of insulating material 118.

After semiconductor device 104 is positioned, insulating material 118 is fully cured, thermally or by way of a combination of heat or radiation. Suitable radiation may include UV light and/or microwaves. In one embodiment, a partial vacuum and/or above atmospheric pressure may be used to promote the removal of volatiles from the insulating material 118 during cure if any are present.

Referring now to FIG. 5, a plurality of vias 124, 126 are formed through insulating substrate 106 and insulating material 118. As shown, vias 124 are aligned with remaining portions of first conductor layer 108 and vias 126 are formed to expose contact pads 122 of semiconductor device 104. Vias 124, 126 may be formed by a UV laser drilling or dry etching, photo-definition, or mechanical drilling process as non-limiting examples. Alternately, vias 124, 126 may be formed by way of other methods including: plasma etching, dry and wet etching, or other laser techniques like CO2 and excimer. In one embodiment, vias 124, 126 are formed having angled side surfaces, as shown in FIG. 5, to facilitate later filling and metal deposition. Vias 124, 126 are subsequently cleaned such as through a reactive ion etching (RIE) desoot process or laser process.

While the formation of vias 124, 126 through insulating substrate 106 and insulating material 118 is shown in FIG. 5 as being performed after placement of digital semiconductor device 104 into insulating material 118, it is recognized that the placement of semiconductor device 104 could occur after via formation. Furthermore, a combination of pre- and post-drilled vias could be employed.

A second conductor layer 128 or metallization layer is then plated on the top surface 130 of insulating substrate 106. Similar to first conductor layer 108, second conductor layer 128 is an electrically conducting material and may be applied using any of the techniques described above with respect to first conductor layer 108. Optionally, a titanium adhesion layer and copper seed layer 129 (FIG. 7A) may first be applied via a sputtering process to the top surface 130 of insulating substrate 106 prior to applying second conductor layer 128.

As shown, second conductor layer 128 extends through vias 126 and electrically couples with contact pads 122 of digital semiconductor device 104. Second conductor layer 128 has a thickness 132 less than the thickness 114 of conductor layer 108. The reduced thickness 132 of second conductor layer 128 permits the portion 134 of second conductor layer 128 electrically coupled to digital semiconductor device 104 to be formed having a routing pattern with a high density routing capability. As used herein, the phrase "high density routing capability" or "high density L/S pattern" refers to a routing capability below 100/100 µm L/S (line/space). In an exemplary embodiment, thickness 132 is in the range of approximately 4 µm-30 µm. However, one skilled in the art will recognize that the thickness 132 of second conductor layer 128 may be varied to correspond to the interconnection pitch of a particular digital semiconductor die 104.

A second layer photoresist mask 136, shown in FIG. 6, is formed on second conductor layer 128 and patterned with openings that define a routing layer electrically connected to contact pads 122 of digital semiconductor device 104 and conductor layer 108. With the second layer photoresist mask 136 in place, second conductor layer 128 is patterned using an etching process. As shown in FIG. 7, the process yields a patterned second conductor layer 128 with openings for a high density L/S pattern that extends out from contact pads 122 of digital semiconductor device 104, through vias 126, and out across the top surface 130 of insulating substrate 106. Together, the first conductor layer 108 and second conductor layer 128 create a multi-thickness conductor layer 138 that extends through insulating substrate 106 and has high density routing capabilities for digital semiconductor device 104 and high current carrying capabilities for power semiconductor device 102. Multi-thickness conductor layer 138 has an overall thickness 139 equal to the combined thicknesses 114, 132 of the first conductor layer 108 and second conductor layer 128 plus the thickness 141 of the insulating substrate 106.

After any remaining portions of second layer photoresist mask 136 are removed, a joining material 140 is used to mechanically and electrically couple power semiconductor device 102 to conductor layer 108. According to various embodiments, joining material 140 may be solder, sintered silver, a conductive adhesive such as a polymer filled with an electrically conductive filler such as silver, or another electrically conductive material able to withstand high temperatures. In one embodiment, a liquid phase bonding joining technique is used to couple power semiconductor device 102 to conductor layer 108.

As shown, joining material 140 is electrically coupled to contact pads 142 or connection pads located on a top surface or active surface 144 of power semiconductor device 102. Similar to contact pads 122 of digital semiconductor device 104, contact pads 142 provide conductive routes (I/O connections) to internal contacts within power semiconductor device 102 and are formed of an electrically conductive material. In the case where power semiconductor device 102 is an IGBT, for example, contact pads 142 are coupled to corresponding emitter and/or gate or anode regions of the power semiconductor device 102. Depending on the device configuration, power semiconductor device 102 may also include at least one lower collector pad or contact pad 146 (shown in phantom) that is disposed on its backside or lower surface 148.

In the fabrication technique described above, power semiconductor device 102 is affixed to conductor layer 108 as a final step of the fabrication technique. Doing so beneficially permits multi-thickness conductor layer 138 to be tested prior to attaching the costly power semiconductor device 102. In alternative embodiments, power semiconductor device 102 may be affixed at any time after forming first conductor layer 108.

Referring to FIGS. 8 and 9, a solder mask layer 150 may be applied over the second conductor layer 128 of electronics package 100 to provide a protective coating and define interconnect pads. Interconnect pads may have a metal finish, such as Ni or Ni/Au, to aid solderability. A series of input/output (I/O) connections 152 are then made to provide a route for electrical connections between the power semiconductor device 102, digital semiconductor device 104, and external components (not shown) such as, for example a busbar or printed circuit board (PCB). Such I/O connections 152 may be provided in the form of plated bumps or pillar bumps, as non-limiting examples.

In some embodiments, power semiconductor device 102 and digital semiconductor device 104 are overcoated with a layer of electrically insulating material 154 to provide rigidity and ease of handling and to prevent arcing between semiconductor devices and other metal components in high voltage applications. Such a configuration is shown in FIG. 8 and is applicable in embodiments where the power semiconductor device 102 is a lateral device that does not include a connection to the backside of the device 102. As shown in FIG. 9, electrically insulating material 154 may also be applied to fill the region between power semiconductor device 102 and conductor layer 108.

In embodiments where power semiconductor device 102 includes one or more lower contact pad 146, a conductive substrate 156 may be provided to create an electrical connection to lower contact pad 146 as shown in FIG. 9. Conductive substrate 156 may be an encapsulated metal lead frame or a multi-layer substrate such as, for example, a printed circuit board (PCB) or DBC substrate as shown in the illustrated embodiment that includes a non-organic ceramic substrate with upper and lower sheets of copper bonded to both sides thereof with a direct bond copper interface or braze layer. The electrical connection between conductive substrate 156 and power semiconductor die 104 is made through a conductive joining layer 158, such as solder, silver paste, or a conductive adhesive as examples, which is formed on lower contact pad 146. In such an embodiment, the connection between conductive substrate 156 and the lower contact pad 146 of power semiconductor device 102 is made prior to filling the volume between the conductive substrate 156 and the insulating substrate 106 with electrically insulating material 154.

An alternative technique for manufacturing an electronics package 160 is illustrated in FIGS. 10-15. Electronics package 160 includes a number of similar components as electronics package 100, and thus numbers used to indicate components in FIGS. 2-9 will also be used to indicate similar components in FIGS. 10-15.

Figure 10:
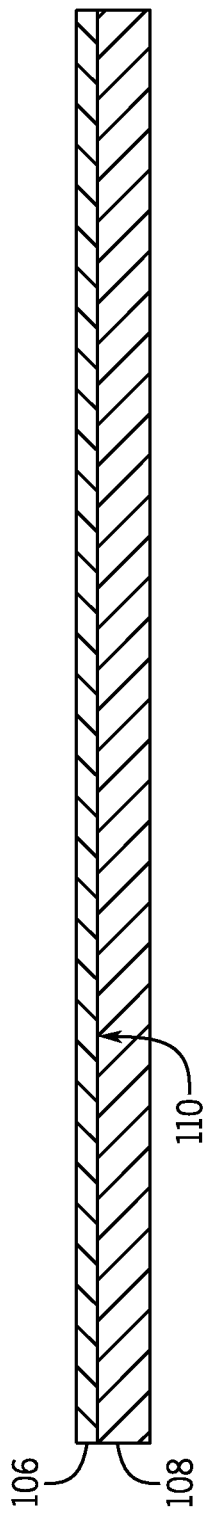
FIGS. 10-15 are schematic cross-sectional side views of an electronics package of during various stages of a manufacturing/build-up process according to another embodiment of the invention.
Figure 11:
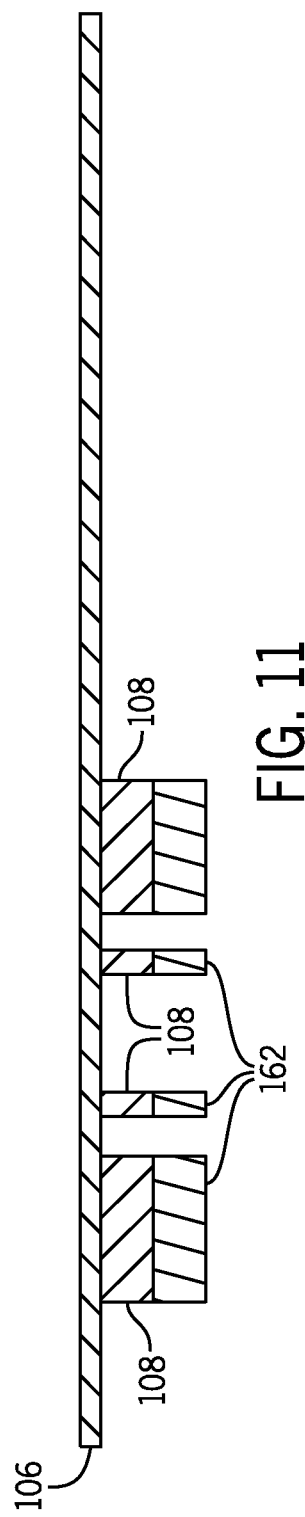
Figure 12:
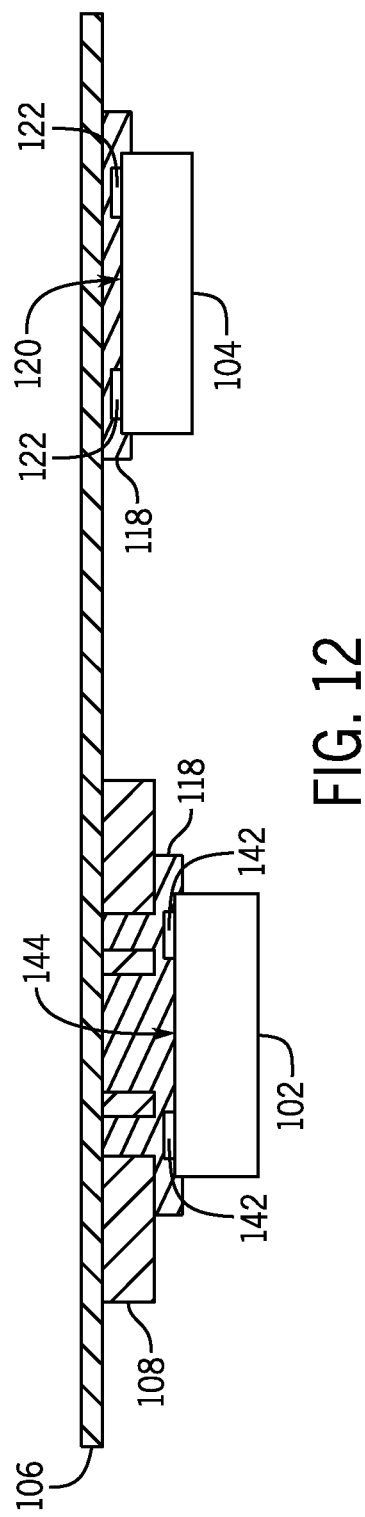

Similar to the manufacturing technique described with respect to FIG. 2, manufacture of electronics package 160 begins by applying a first conductor layer 108 to the bottom surface 110 of insulating substrate 106, as shown in FIG. 10. Alternatively, fabrication of electronics package 160 may begin with a metal-clad dielectric substrate. A first layer photoresist mask 162 (FIG. 11) is then applied to mask the portion of conductor layer 108 corresponding to a low density L/S pattern. An etching technique is used to remove portions of the conductor layer 108 exposed by the first layer photoresist mask 162.

Figure 13:
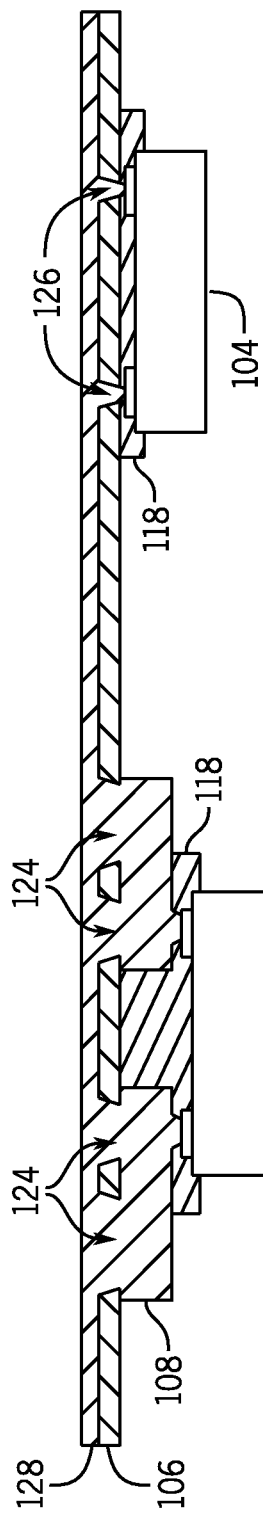

Insulating material 118 (FIG. 12) is next applied and used to affix digital semiconductor device 104 and power semiconductor device 102 to insulating substrate 106. After insulating material 118 is cured, a series of vias 124, 126 are formed through insulating substrate 106, conductor layer 108 and cured insulating material 118, as shown in FIG. 13.

Second conductor layer 128 is then formed on the top surface 130 of insulating substrate 106 and extends through vias 124, 126 to electrically connect to contact pads 122, 142.

Figure 14:
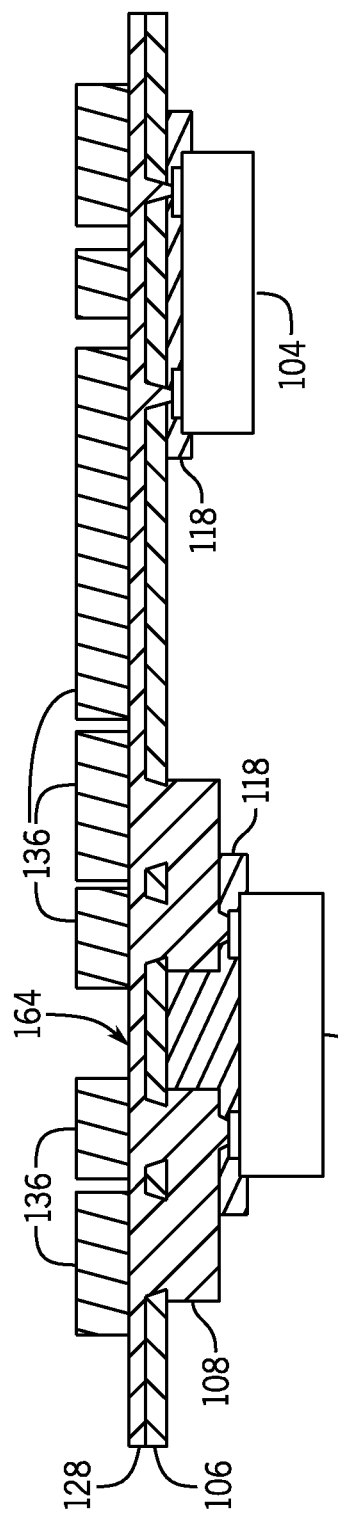
Figure 15:
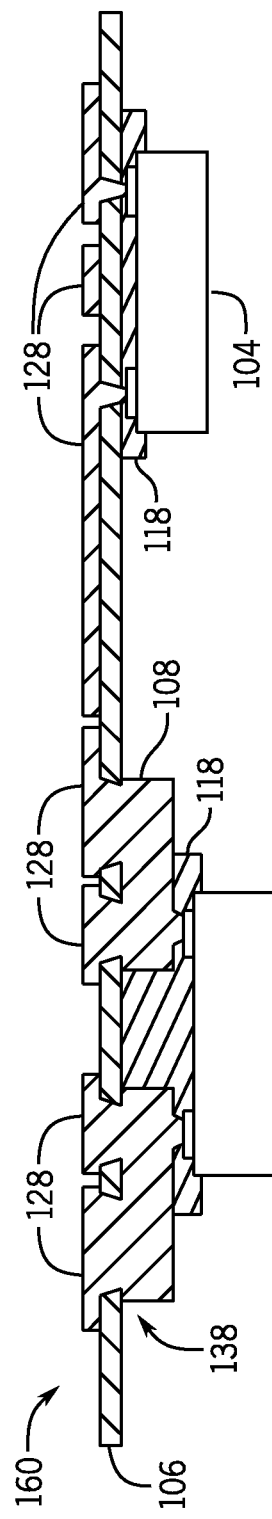

Referring to FIG. 14, a second layer photoresist mask 136 is applied to the top surface 164 of the second conductor layer 128. Select portions of second photoresist mask 136 are removed to define a high density L/S pattern. The exposed portions of second conductor layer 128 are then removed using an etching technique resulting in the formation of the high density L/S pattern, as shown in FIG. 15. After etching process is complete, the remaining portions of second layer photoresist mask 136 are removed using a stripping technique to yield the electronics package 160 shown in FIG. 15. The multi-thickness conductor layer 138 formed by the combination of first conductor layer 108 and second conductor layer 128 thus includes a high density routing pattern for electrical connections to digital semiconductor device 104 and a low density routing pattern with high current carrying capabilities for power semiconductor device 102.

Similar to the embodiments illustrated in FIGS. 8 and 9, fabrication of electronics package 160 may also include the addition of an electrically insulating material and I/O connections. Where one or more of the embedded electrical components includes a backside contact pad, similar to contact pad 146 of FIG. 7, a conductive substrate may be included to provide an electrical connection thereto in a similar manner as illustrated in FIG. 9.

Beneficially, use of the multi-thickness conductor layer enables locating disparate electrical components much closer in proximity to each other than prior art techniques such as that shown in FIG. 1, while providing the requisite high density routing capabilities and high current carrying capabilities for the different types of electrical components. The multi-thickness conductor layer also provides a shorter and less complex conductor structure between electrical components as compared to the prior art techniques, thus improving the reliability of electrical connections within the packaging structure.

Therefore, according to one embodiment of the invention, an electronics package includes an insulating substrate, a first electrical component coupled to a first surface of the insulating substrate, and a first conductor layer formed on the first surface of the insulating substrate. A second conductor layer is formed on a second surface of the insulating substrate, opposite the first surface, the second conductor layer extending through vias in the insulating substrate to contact at least one contact pad of the first electrical component and couple with the first conductor layer. The electronics package also includes a second electrical component having at least one contact pad coupled to the first conductor layer. The first conductor layer has a thickness greater than a thickness of the second conductor layer.

According to another embodiment of the invention, a method of manufacturing an electronics package includes providing an insulating substrate, forming a first conductor layer on a first surface of the insulating substrate, and coupling a first electrical component to the first surface of the insulating substrate. The method also includes coupling a second electrical component to the first conductor layer and forming a second conductor layer on a second surface of the insulating substrate, opposite the first surface. The second conductor layer extends through vias formed in the insulating substrate to electrically couple with the first conductor layer and contact at least one contact pad on the first electrical component. The first conductor layer is formed having a thickness greater than a thickness of the second conductor layer.

According to yet another embodiment of the invention, an electronics package includes an insulating substrate having a top surface and a bottom surface and a multi-thickness conductor extending through vias in the insulating substrate. The multi-thickness conductor includes a first conductor layer formed on the bottom surface of the insulating substrate and a second conductor layer formed on the top surface of the insulating substrate and electrically coupled with the first patterned conductor layer through a portion of the vias, the second patterned conductor layer having a thickness less than a thickness of the first patterned conductor layer. A first electrical component is affixed to the bottom surface of the insulating substrate, the first electrical component having a plurality of contact pads electrically coupled to the second conductor layer through another portion of the vias. A second electrical component having at least one contact pad is coupled to the first conductor layer.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
    a multi-thickness conductor comprising a first portion and a second portion thicker than the first portion;
    an insulating substrate positioned between the first and second portions of the multi-thickness conductor;
    a first electrical component coupled to a first surface of the insulating substrate and electrically connected to the first portion of the multi-thickness conductor through at least one via in the insulating substrate; and
    a second electrical component coupled to the second portion of the multi-thickness conductor;
    wherein the first portion of the multi-thickness conductor is electrically coupled to the second portion of the multi-thickness conductor through at least another via in the insulating substrate.

2. The electronics package of claim 1 wherein the first electrical component comprises a digital semiconductor component and the second electrical component comprises a power semiconductor component.

3. The electronics package of claim 1 further comprising an electrically insulating material that coats portions of the first electrical component, the second electrical component, and the first surface of the insulating substrate.

4. The electronics package of claim 3 wherein the electrically insulating material fills a region between the second electrical component and the first surface of the insulating substrate.

5. The electronics package of claim 3 further comprising a conductive substrate coupled to a contact pad on a backside surface of the second electrical component;
    wherein contact pads on an active surface of the second electrical component are coupled to the second portion of the multi-thickness conductor; and wherein electrically insulating material fills a region between the first surface of the insulating substrate and the conductive substrate.

6. The electronics package of claim 1 further comprising a layer of insulating material that adheres the first electrical component to the insulating substrate.

7. The electronics package of claim 1 further comprising a joining material that mechanically and electrically couples contact pads on an active surface of the second electrical component to the second portion of the multi-thickness conductor.

8. The electronics package of claim 1 further comprising a layer of insulating material that adheres the first and second electrical components to the insulating substrate.

9. The electronics package of claim 8 wherein contact pads on an active surface of the second electrical component are electrically coupled to the second portion of the multi-thickness conductor through vias in the layer of insulating material.

10. A method of manufacturing an electronics package comprising:
    forming a first portion of a multi-thickness conductor;
    forming a second portion of the multi-thickness conductor, the second portion thicker than the first portion;
    electrically coupling the first portion of the multi-thickness conductor to the second portion of the multi-thickness conductor through at least one via in an insulating substrate;
    affixing an active surface of a first electrical component to a first surface of the insulating substrate;
    electrically coupling the active surface of the first electrical component to the first portion of the multi-thickness conductor through at least another via in the insulating substrate; and
    affixing an active surface of a second electrical component to the second portion of the multi-thickness conductor.

11. The method of claim 10 further comprising sputtering an adhesion layer and a seed layer on at least one of the first surface of the insulating substrate and a second surface of the insulating substrate.

12. The method of claim 11 wherein sputtering the adhesion layer and the seed layer comprises sputtering a titanium adhesion layer and a copper seed layer.

13. The method of claim 10 further comprising applying the first conductor layer directly to a second surface of the insulating substrate.

14. The method of claim 10 further comprising applying the second conductor layer directly to the first surface of the insulating substrate.

15. The method of claim 10 further comprising forming the first portion of the multi-thickness conductor on a second surface of the insulating substrate, opposite the first surface.

16. The method of claim 10 further comprising forming the second portion of the multi-thickness conductor on the first surface of the insulating substrate.

17. The method of claim 10 further comprising:
    applying a layer of insulating material to the first surface of the insulating substrate; and
    affixing the first electrical component to the insulating substrate with the layer of insulating material.

18. The method of claim 17 further comprising affixing the second electrical component to the insulating substrate with the layer of insulating material.

19. The method of claim 10 further comprising coating portions of the first electrical component, the second electrical component, and the first surface of the insulating substrate with a layer of electrically insulating material.

20. An electronics package comprising:
    an insulating substrate;
    a first electrical component coupled to a first surface of the insulating substrate;
    a multi-thickness conductor comprising:
        a first conductor layer proximate the first surface of the insulating substrate;
        a second conductor layer proximate a second surface of the insulating substrate, opposite the first surface, the second conductor layer thinner than the first conductor layer;
        wherein the second conductor layer extends through at least one via in the insulating substrate to contact at least one contact pad on an active surface of the first electrical component; and
        wherein the second conductor layer extends through at least another via in the insulating substrate to contact the first conductor layer; and
    a second electrical component coupled to the first conductor layer.

21. The electronics package of claim 20 wherein the first conductor layer is applied directly to the first surface of the insulating substrate.

22. The electronics package of claim 20 further comprising an adhesion layer and a seed layer applied to the first surface of the insulating substrate.

23. The electronics package of claim 22 wherein the adhesion layer comprises titanium and the seed layer comprise copper.

24. The electronics package of claim 20 wherein the second conductor layer is applied on the second surface of the insulating substrate.

25. The electronics package of claim 20 further comprising an adhesion layer and a seed layer applied to the second surface of the insulating substrate prior to applying the second conductor layer.

26. The electronics package of claim 25 wherein the adhesion layer comprises titanium and the seed layer comprise copper.

27. The electronics package of claim 20 wherein the first conductor layer comprises copper.

28. The electronics package of claim 20 wherein the first electrical component comprises a digital semiconductor component and the second electrical component comprises a power semiconductor component.

* * * * *